(12) United States Patent
Miyanaga et al.

(10) Patent No.: US 8,362,748 B2
(45) Date of Patent: Jan. 29, 2013

(54) VOLTAGE COMPARISON CIRCUIT

(75) Inventors: Koichi Miyanaga, Kyoto (JP); Yutaka Shibata, Kyoto (JP)

(73) Assignee: Rohm Co., Ltd. (JP)

( * ) Notice: Subject to any disclaimer, the term of this patent is extended or adjusted under 35 U.S.C. 154(b) by 1013 days.

(21) Appl. No.: 12/210,063

(22) Filed: Sep. 12, 2008

(65) Prior Publication Data

US 2009/0066293 A1 Mar. 12, 2009

(30) Foreign Application Priority Data

Sep. 12, 2007 (JP) ................................ 2007-237024
Sep. 12, 2007 (JP) ................................ 2007-237093
Sep. 19, 2007 (JP) ................................ 2007-242961

(51) Int. Cl.
*H02J 7/00* (2006.01)
*H02J 7/16* (2006.01)

(52) U.S. Cl. ........ 320/132; 320/134; 320/152; 320/157; 320/159

(58) Field of Classification Search .................... 320/132
See application file for complete search history.

(56) References Cited

U.S. PATENT DOCUMENTS 7,626,353 B2 * 12/2009 Kanouda et al. ............... 320/101
7,760,106 B2 * 7/2010 Vandensande et al. ..... 340/636.1

FOREIGN PATENT DOCUMENTS

| JP | S61-8677 | 1/1986 |
|---|---|---|
| JP | 3-49418 | 3/1991 |
| JP | 9-219935 | 8/1997 |
| JP | 10-290144 A | 10/1998 |
| JP | 11-18277 A | 1/1999 |
| JP | 11-313448 | 11/1999 |
| JP | 2001-119862 A | 4/2001 |
| JP | 2001-186684 | 7/2001 |
| JP | 2002-10509 A | 1/2002 |
| JP | 2002-300774 A | 10/2002 |
| JP | 2003-143768 A | 5/2003 |
| JP | 2003-204631 | 7/2003 |
| JP | 2004-282846 A | 10/2004 |
| JP | 2006-60977 | 3/2006 |
| JP | 2006-204021 A | 8/2006 |
| JP | 2006-304500 | 11/2006 |
| WO | 97/44884 A1 | 11/1997 |

OTHER PUBLICATIONS

Notificiation of Reason(s) for Refusal for Japanese Patent Application No. 2007-242961, dispatched May 8, 2012, with English translation.
Notification of Reason(s) for Refusal for Japanese Patent Application No. 2007-237024, dispatched Dec. 6, 2011 with English translation.
Notification of Reason(s) for Refusal for Japanese Patent Application No. 2007-237093, dispatched Feb. 7, 2012, with English translation.

*Primary Examiner* — Edward Tso
*Assistant Examiner* — Ahmed Omar
(74) *Attorney, Agent, or Firm* — Cantor Colburn LLP (57) ABSTRACT

A voltage comparison circuit makes a comparison between a first voltage and a second voltage. A resistor and a constant current source are provided in series between the first voltage and the ground voltage. A comparator receives the second voltage via one input terminal (non-inverting input terminal), and the voltage at a connection node between the aforementioned resistor and the constant current source via the other input terminal (inverting terminal). The first voltage is preferably used as the power supply voltage for the comparator.

17 Claims, 5 Drawing Sheets

RELATED ART

VOLTAGE COMPARISON CIRCUIT

BACKGROUND OF THE INVENTION

1. Field of the Invention

The present invention relates to a power supply.

2. Description of the Related Art

In recent years, various kinds of electronic devices such as PDAs (Personal Digital Assistants), laptop personal computers, etc., include a great number of electronic circuits mounted thereon. Examples of such electronic circuits include: a CPU (Central Processing Unit) and a DSP (Digital Signal Processor) each of which performs digital signal processing; a liquid crystal panel; and other analog circuits and digital circuits. In a battery-driven electronic device which includes a battery as a power supply, each electronic circuit included therein operates using the battery voltage generated by the battery.

PATENT DOCUMENT 1

Japanese Patent Application Laid Open No. H9-219935

PATENT DOCUMENT 2

Japanese Patent Application Laid Open No. H3-49418

PATENT DOCUMENT 3

Japanese Patent Application Laid Open No. S61-8677

PATENT DOCUMENT 4

Japanese Patent Application Laid Open No. H11-313448

PATENT DOCUMENT 5

Japanese Patent Application Laid Open No. 2001-186684

PATENT DOCUMENT 6

Japanese Patent Application Laid Open No. 2003-204631

PATENT DOCUMENT 7

Japanese Patent Application Laid Open No. 2006-60977

PATENT DOCUMENT 8

Japanese Patent Application Laid Open No. 2006-304500

1. Electronic devices are known having a function of receiving electric power supplied from an external power supply such as an AC adapter, USB (Universal Serial Bus) port, or the like. Such an arrangement enables operation to be performed if the remaining battery charge becomes low, or even if a battery is not mounted on the electronic device. With such an arrangement, a power supply management circuit (power management IC) is provided, which performs a control operation for switching the voltage, which is to be used to operate the electronic device, between the voltage supplied from the external power supply and the voltage supplied from the battery. In a case in which the battery is a secondary battery such as a lithium-ion battery, the power supply management circuit includes a function for charging the battery using the voltage supplied from the external power supply. The power supply management circuit compares the voltage supplied from the external power supply with the battery voltage, and performs control operations so as to select the voltage to be supplied to a load, according to the comparison result.

Let us consider a voltage comparison circuit which compares the voltage supplied from the external power supply with the battery voltage. In an ordinary comparator, there is headroom (reactive voltage range) around the battery voltage, leading to a problem in that voltage comparison cannot be performed with high precision. Accordingly, in a case in which the electric power is supplied from either an external power supply or a battery, it is difficult for the comparator to make a comparison between the voltage from the external power supply and the battery voltage. In order to reduce the voltage levels of the external power supply and the battery voltage, an arrangement is conceivable which employs a resistive divider. However, such an arrangement has a problem of degradation in the determination conditions in the voltage comparison and reduced precision of the voltage comparison due to irregularities in the resistors. It should be noted that such a problem is not limited to a power supply management circuit. Also, other ordinary voltage comparison circuits involve such a problem.

2. In recent years, secondary batteries, which are rechargeable batteries, are employed. Examples of secondary batteries include lithium-ion batteries, nickel hydride batteries, etc. In general, the charging operation processing for a secondary battery is performed as follows. That is to say, in a state in which the battery voltage is low, a preliminary charging operation is performed. After the battery voltage increases to a certain level, the charging current is used as a feedback signal, and the charging operation is performed such that the charging current is maintained at a constant value (constant current charging). When the battery voltage becomes close to the fully charged state, the battery voltage is used as a feedback signal, and the charging operation (constant voltage charging) is performed such that the battery voltage matches a predetermined reference voltage (fully charging voltage). When the battery voltage matches a predetermined reference voltage, the fully charged state is detected, whereupon the charging operation ends. After the completion of the charging, in a case in which the battery voltage reduces to a predetermined threshold voltage (recharge detection voltage) due to exhaustion of the battery, the recharging operation is started (recharge detection).

As described in the aforementioned Patent Documents 4 through 6, in order to provide a constant current charging operation, in general, the charging current to be supplied to the battery is converted into a voltage, and a feedback operation is performed such that the voltage thus converted matches the reference voltage. In general, in a case in which the charging current is converted into a voltage, the current that corresponds to the charging current is passed through a detection resistor, utilizing the voltage drop thus generated. In a case in which no terminal of the detection resistor is grounded, such a circuit requires another conversion circuit which further converts the voltage drop into a voltage based on the ground voltage. That is to say, the voltage drop is converted into a current by means of the conversion circuit. The current thus converted is passed through a resistor, one terminal of which is grounded, thereby converting the current to a voltage based on the ground voltage. Then, an error amplifier makes a comparison between the voltage thus converted and the reference voltage. Such an arrangement requires a dedicated conversion circuit for performing this comparison processing, leading to a problem of an enlarged circuit area.

3. In general, the charging circuits can be classified into two types, i.e., a linear regulator type which controls the on-resistance of a transistor according to a feedback operation, and a switching regulator type using a switching regulator.

An arrangement employing a switching regulator in the charging circuit has the following problem.

In a case in which a switching regulator is employed, and in which the switching regulator is connected to an ordinary circuit as a load, the output voltage is determined by the switching regulator. However, in a case in which the switching regulator is connected to a battery so as to charge the battery, the output voltage depends on the battery. This leads to a problem in that, when the voltage of the battery connected to the switching regulator is low, an extremely large amount of charging current passes through the battery, or a reverse current flows to the ground via a low side switch of the switching regulator.

SUMMARY OF THE INVENTION

1. An embodiment of the present invention has been made in view of such problems. Accordingly, it is a general purpose of the present invention to provide a voltage comparison circuit which enables stable voltage comparison to be made.
2. Another embodiment of the present invention has been made in view of such problems. Accordingly, it is another general purpose of the present invention to provide a current control circuit which enables a feedback operation to be performed in a simple configuration.
3. Yet another embodiment of the present invention has been made in view of such problems. Accordingly, it is yet another general purpose of the present invention to provide a charge control circuit which controls a charging current or suppresses a reverse current.
1. An embodiment of the present invention relate to a voltage comparison circuit which makes a comparison between a first voltage and a second voltage. The voltage comparison circuit comprises: a resistor and a constant current source provided in series between the first voltage and a fixed voltage; and a comparator which receives the second voltage at one input terminal, and which receives the voltage at a connection node between the resistor and the constant current source at another input terminal.

The voltage drop $\Delta V$ occurs at the resistor in proportion to the current generated by the constant current source. Accordingly, at the other input terminal, the comparator receives the voltage (V1−$\Delta V$) (or (V1+$\Delta V$)), which is obtained by shifting the first voltage V1 by the voltage drop $\Delta V$, as an input signal. Thus, the comparator makes a comparison between the voltage (V1−$\Delta V$) and the second voltage V2, thereby providing stable voltage comparison.

Also, the power supply voltage for the comparator may be set to the first voltage.

Also, at the inverting input terminal, the comparator may receive the voltage at the connection node between the resistor and the constant current source. Also, at the non-inverting input terminal, the comparator may receive the second voltage.

Another embodiment of the present invention relates to a power supply management circuit. The power supply management circuit comprises: a first terminal at which an external power supply is connected; a second terminal to which a battery is connected; the above-described voltage comparison circuit which performs voltage comparison with respect to the voltage applied to the first terminal from the external power supply and the battery voltage output from the battery, one of which is used as the first voltage, and the other of which is used as the second voltage; a selection circuit which selects one of the voltage received from the external power supply and the battery voltage output from the battery, according to an output signal of the voltage comparison circuit; and an output terminal via which the voltage thus selected by the selection circuit is output to an external load circuit.

Also, the voltage comparison circuit may receive the voltage from the external power supply as the first voltage, and may receive the battery voltage from the battery as the second voltage. Also, the comparator may receive the voltage from the external power supply as the power supply voltage, may receive the battery voltage from the battery at the inverting input terminal, and may receive the voltage at a connection node between the resistor and the constant current source at the non-inverting input terminal.

Also, the power supply management circuit may further include a charging control unit which charges the battery using the voltage received from the external power supply.

Yet another embodiment of the present invention relates to an electronic device. The electronic device comprises: a battery; an adapter terminal to which an external power supply can be detachably mounted; the above-described power supply management circuit; and a load circuit connected to an output terminal of the power supply management circuit.

2. Yet another embodiment of the present invention relates to a charge control circuit which receives an external voltage so as to charge a battery. The charge control circuit comprises: an input terminal at which the external voltage is received from an external power supply; a battery terminal at which the battery is connected; a detection resistor which is provided on a charging path for the battery; a reference resistor, a first terminal of which is connected to a first terminal of the detection resistor such that they form a common terminal; a constant current source which supplies a predetermined constant current to the reference resistor; an error amplifier which generates an error voltage according to the difference between a detection voltage at a second terminal of the detection resistor and a reference voltage at a second terminal of the reference resistor; and a charging driver which receives the error voltage from the error amplifier, and which supplies a charging current to the battery such that the detection voltage matches the reference voltage by means of a feedback operation, thereby charging the battery.

With such an embodiment, a voltage drop occurs at the detection resistor in proportion to the charging current. On the other hand, another voltage drop occurs at the reference resistor in proportion to the constant current. Thus, such an arrangement compares the voltage that occurs at the detection resistor with the reference voltage such that these two voltage drops matches each other by means of the feedback operation without involving the step for the voltage/current conversion or the current/voltage conversion.

Also, the first terminal of the detection resistor and the first terminal of the reference resistor may be connected to the battery terminal.

Also, the power supply voltage for the error amplifier may be set to the external voltage. With such an embodiment, there is no need to use the battery voltage as the power supply voltage for the error amplifier, and accordingly, the external voltage is used as the power supply voltage for the error amplifier. Thus, such an arrangement provides constant current charging operation even if the battery voltage is low.

Yet another embodiment of the present invention relates to an electronic device. The electronic device comprises: a battery; an adapter terminal to which an external power supply can be detachably mounted; and the above-described charge control circuit.

3. Yet another embodiment of the present invention relates to a charge control circuit which receives an external voltage so as to charge a battery. The charge control circuit comprises: a synchronous rectification switching regulator which charges the battery using the external voltage; a pulse modulator which generates a pulse signal with a duty ratio adjusted according to the charging state of the battery; and a driver which drives a switching device included in the switching regulator according to a pulse signal received from the pulse modulator. With such an arrangement, as a switching device, the switching regulator includes a high-side transistor and a low-side transistor provided in series between an external terminal to which the external voltage is applied and a ground terminal. Furthermore, the switching regulator is configured such that at least one of the on-resistances of the high-side transistor and the low-side transistor can be switched.

With such an embodiment, either the on-resistance of the high-side transistor or the on-resistance of the low-side transistor is controlled according to the charging state. Thus, such an arrangement controls the charging current. Alternatively, such an arrangement suppresses the reverse current.

Also, in a case in which the voltage of the battery is smaller than a predetermined threshold voltage, at least one of the on-resistance of the high-side transistor and the on-resistance the low-side transistor, which is the on-resistance of a switchable transistor, may be set to a greater value. Also, in a case in which the voltage of the battery is greater than the predetermined threshold voltage, at least one of the on-resistance of the high-side transistor and the on-resistance of the low-side transistor may be set to a smaller value.

Such an arrangement properly controls charging current, or suppresses the reverse current by switching the on-resistance of the transistor according to the battery voltage.

Also, during a predetermined period from the start of charging the battery, at least one of the on-resistance of the high-side transistor and the on-resistance the low-side transistor, which is the on-resistance of a switchable transistor, may be set to a greater value.

Also, during a predetermined period from the start of charging the battery, at least one of the on-resistance of the high-side transistor and the on-resistance the low-side transistor, which is the on-resistance of a switchable transistor, is set to a greater value. Also, in a case in which the voltage of the battery is smaller than a predetermined threshold voltage after the predetermined period has elapsed, at least one of the on-resistance of the high-side transistor and the on-resistance the low-side transistor may be set to a greater value. Also, in a case in which the voltage of the battery is greater than the predetermined threshold voltage after the predetermined period has elapsed, at least one of the on-resistance of the high-side transistor and the on-resistance the low-side transistor may be set to a smaller value.

Also, the high-side transistor may include a main high-side transistor and a sub high-side transistor provided in parallel with the main high-side transistor. Also, the driver may switch an internal transistor included in the high-side transistor to be driven, according to the state of the battery.

With such an arrangement, the on-resistance of the high-side transistor is suitably switched, thereby controlling the charging current.

Also, the low-side transistor may include a main low-side transistor and a sub low-side transistor provided in parallel with the main low-side transistor. Also, the driver may switch an internal transistor included in the low-side transistor to be driven, according to the state of the battery.

With such an arrangement, the on-resistance of the low-side transistor is suitably switched, thereby suppressing the reverse current.

Also, the high-side transistor may include a main high-side transistor and a sub high-side transistor provided in parallel with the main high-side transistor. Also, the low-side transistor may include a main low-side transistor and a sub low-side transistor provided in parallel with the main low-side transistor. Also, the driver may switch an internal transistor included in the high-side transistor to be driven, and an internal transistor included in the low-side transistor to be driven, according to the state of the battery.

With such an arrangement, the on-resistance of the high-side transistor and the on-resistance of the low-side transistor are suitably switched. Thus, such an arrangement controls the charging current, and suppresses the reverse current.

Yet another embodiment of the present invention relates to an electronic device. The electronic device comprises: a battery; and the above-described charge control circuit which receives an external voltage from an external power supply so as to charge the battery.

It is to be noted that any arbitrary combination or rearrangement of the above-described structural components and so forth is effective as and encompassed by the present embodiments.

Moreover, this summary of the invention does not necessarily describe all necessary features so that the invention may also be a sub-combination of these described features.

BRIEF DESCRIPTION OF THE DRAWINGS

Embodiments will now be described, by way of example only, with reference to the accompanying drawings which are meant to be exemplary, not limiting, and wherein like elements are numbered alike in several Figures, in which.

DETAILED DESCRIPTION OF THE INVENTION

The invention will now be described based on preferred embodiments which do not intend to limit the scope of the present invention but exemplify the invention. All of the features and the combinations thereof described in the embodiment are not necessarily essential to the invention.

In the present specification, the state represented by the phrase "the member A is connected to the member B" includes a state in which the member A and the member B are physically and directly connected to each other. Also, the state represented by such a phrase include a state in which the member A and the member B are indirectly connected to each other via another member that does not affect the electric connection between the member A and the member B.

Similarly, the state represented by the phrase "the member C is provided between the member A and the member B" includes a state in which the member A and the member C, or the member B and the member C are physically and directly connected to each other. Also, the state represented by such a phrase include a state in which the member A and the member C, or the member B and the member C are indirectly connected to each other via another member that does not affect the electric connection.

In the present specification, each reference character which indicates a voltage signal, a current signal, or a resistor, also represents the voltage value, the current value, or the resistance value thereof.

FIRST EMBODIMENT

Figure 1:
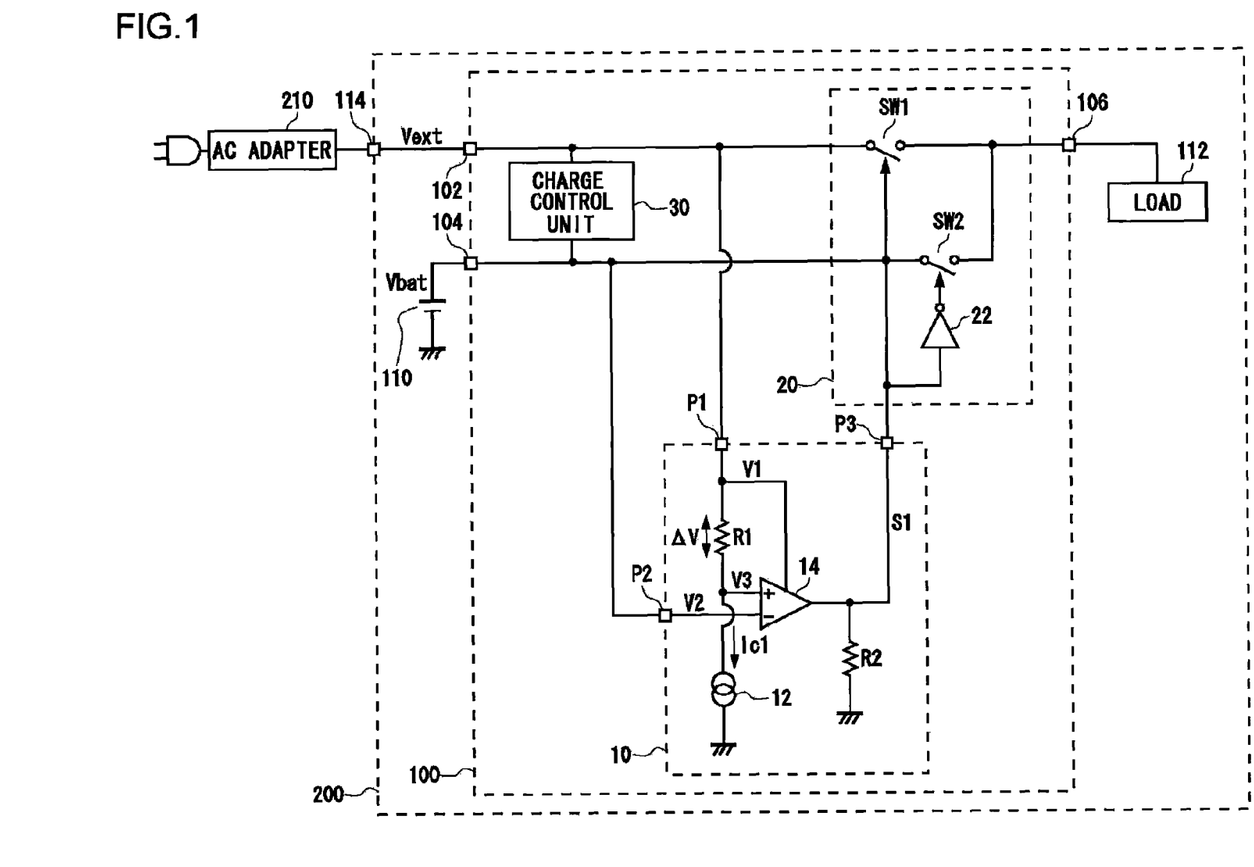
FIG. 1 is a circuit diagram which shows a configuration of an electronic device including a power management circuit according to a first embodiment.

FIG. 1 is a circuit diagram which shows a configuration of an electronic device 200 including a power supply management circuit 100 according to a first embodiment. For example, the electronic device 200 is a battery-driven information terminal device such as a cellular phone terminal, a PDA, a laptop PC, or the like. The electronic device 200 includes the power supply management circuit 100, a battery 110, an adapter terminal 114, and a load 112.

The battery 110 is a secondary battery such as a lithium-ion battery, a nickel hydride battery, or the like, which outputs the battery voltage Vbat. The adapter terminal 114 is a terminal to which an external power supply 210 can be detachably mounted, and which receives the voltage (which will be referred to as the "external voltage" hereafter) Vext from the external power supply 210. The power supply management circuit 100 receives the external voltage Vext and the battery voltage Vbat, selects one of these two voltages, and supplies the voltage thus selected to the load 112. In addition, the power supply management circuit 100 charges the battery 110 using the external voltage Vext. Examples of the load 112 include an unshown power supply circuit, DSP, liquid crystal panel, and other analog circuits and digital circuits.

The power supply management circuit 100 includes a voltage comparison circuit 10, a selection circuit 20, and a charging control unit 30, and is integrally formed on a semiconductor substrate as a functional IC. The power supply management circuit 100 receives the external voltage Vext at an adapter terminal 102, and receives the battery voltage Vbat at a battery terminal 104. The voltage comparison circuit 10 makes a comparison between the external voltage Vext and the battery voltage Vbat, and outputs a control signal S1, which indicates the comparison result, to the selection circuit 20. The selection circuit 20 selects either the external voltage Vext or the power supply voltage Vbat based upon the result of the comparison made by the voltage comparison circuit 10, i.e., according to the control signal S1. Then, the selection circuit 20 outputs the voltage thus selected to the load 112 via an output terminal 106. The charging control unit 30 charges the battery 110 using the external voltage Vext.

The selection circuit 20 includes a first switch SW1, a second switch SW2, and a NOT gate 22. The first switch SW1 is provided between the output terminal 106 and the adapter terminal 102. The second switch SW2 is provided between the output terminal 106 and the battery terminal 104. The first switch SW1 receives the control signal S1 as an input signal, and the second switch SW2 receives the inverse of the control signal S1 inverted by the NOT gate 22 as an input signal. Each of the first switch SW1 and the second switch SW2 operates such that, when it receives a control signal at the high level, it is switched to the ON state. That is to say, when the control signal S1 enters the high level state, the first switch SW1 is switched to the ON state, thereby selecting the external voltage Vext. On the other hand, when the control signal S1 enters the low level state, the second switch SW2 is switched to the ON state, thereby selecting the battery voltage Vbat. The configuration of the selection circuit 20 is not restricted in particular. For example, an ordinary multiplexer may be employed.

The voltage comparison circuit 10 includes a first terminal P1, a second terminal P2, an output terminal P3, a constant current source 12, a comparator 14, a resistor R1, and a pull-down resistor R2. The voltage comparison circuit 10 makes a comparison between the first voltage V1 input to the first terminal P1 and the second voltage V2 input to the second terminal P2. The external voltage Vext is input to the first terminal P1, and the battery voltage Vbat is input to the second terminal P2. That is to say, in FIG. 1, the V1 is set to the Vext, and the V2 is set to the Vbat.

The resistor R1 and the constant current source 12 are provided in series between the first terminal P1, to which the first voltage V1 is applied, and the ground terminal, to which the constant voltage (ground voltage) is applied. The constant current source 12 generates a predetermined constant current Ic1, and the constant current Ic1 thus generated is passed through the resistor R1. As a result, a voltage drop $\Delta V$ (=Ic1× R1) occurs in the resistor R1. The resistance of the resistor R1 and the constant current Ic1 are set such that the voltage drop $\Delta V$ is set to the 0.1 V level.

The comparator 14 receives the second voltage V2 via one input terminal (inverting input terminal). Furthermore, via the other input terminal (non-inverting input terminal), the comparator 14 receives the voltage V3 at a node between the resistor R1 and the constant current source 12. The voltage V3 at this node is represented by the following Expression.

$$V3 = V1 - \Delta V = V1 - R1 \times Ic1$$

In the first embodiment, the first voltage V1 is used as a power supply voltage for the comparator 14. The output of the comparator 14 is pulled down by means of the pull-down resistor R2.

Description will be made regarding the operation of the power supply management circuit 100 thus configured. The operation of the power supply management circuit 100 is classified into the following two operations, and description will be made below regarding these two operations thus classified.

(1) Operation in a state in which the external power supply 210 is connected to the adapter terminal 114, and the external voltage Vext is supplied to the electronic device 200.

(2) Operation in a state in which the external power supply 210 is not connected to the adapter terminal 114.

(1) A state in which the external power supply 210 is connected to the adapter terminal 114.

In this state, the power supply voltage is supplied to the comparator 14 of the voltage comparison circuit 10, and a voltage comparison can be made. When (V1−$\Delta V$) is greater than V2, the control signal S1 output from the comparator 14 is set to the high level state. On the other hand, when (V1−$\Delta V$) is smaller than V2, the control signal S1 output from the comparator 14 is set to the low level state. In other words, determination is made whether or not the voltage difference (V1−V2) is greater than $\Delta V$.

For example, in a case in which the external voltage Vext is set to the rated voltage of 5 V, and the battery voltage Vbat fluctuates between the 3.2 V level and the 4.2 V level, the control signal S1 is set to the high level state, thereby supplying the external voltage Vext to the load 112. On the other hand, in a case in which the external voltage Vext supplied from the external power supply 210 drops below the 4 V level, the control signal S1 is set to the low level state, thereby supplying the battery voltage Vbat to the load 112.

(2) A state in which the external power supply 210 is not connected to the adapter terminal 114.

In this state, the power supply voltage is not supplied to the comparator 14. Accordingly, the voltage comparison is not performed, and the output of the comparator 14 is set to the low level state. When the output of the comparator 14 is set to the open state, the control signal S1 is pulled down to the low level state by means of the pull-down resistor R2. Accordingly, the second switch SW2 is turned on, thereby supplying the battery voltage Vbat to the load 112.

The effect of the voltage comparison circuit 10 can be more clearly understood by referring to the description below.

Now, let us consider an arrangement in which the voltage comparison is made after each of the first voltage V1 and the second voltage V2 is divided by means of a resistor, instead of employing the voltage comparison circuit 10 shown in FIG. 1. Specifically, let us consider an arrangement in which voltage comparison is made between the voltage obtained by multiplying the first voltage V1 by $\alpha$ and the voltage obtained by multiplying the second voltage V2 by $\beta$. With such an arrangement, comparison is made between (V1×$\alpha$) and (V2×$\beta$). That is to say, when (V1×$\alpha$) is greater than (V2×$\beta$), the output of the comparator is set to the high level state. On the other hand, when (V1×$\alpha$) is smaller than (V2×$\beta$), the output of the comparator is set to the low level state. However, the determination conditions change if the value of $\alpha$ or $\beta$ changes due to irregularities in the resistive divider.

On the other hand, the voltage comparison circuit 10 according to the first embodiment makes a comparison between a voltage obtained by shifting the first voltage V1 by $\Delta V$ and the second voltage V2. Thus, such an arrangement ensures that the voltage drop $\Delta V$ is equal to or greater than 0 regardless of changes in the resistance of the resistor R1 and the constant current Ic1. This maintains the comparison conditions (magnitude correlation) between the first voltage V1 and the second voltage V2, thereby maintaining the determination conditions.

With such an arrangement, the first voltage V1, the level of which is to be shifted, is used as the power supply voltage for the comparator 14. Furthermore, the voltage V3 obtained by shifting the level of the first voltage V1 is input to the inverting input terminal, and the second voltage V2 is input to the non-inverting input terminal, giving consideration to the output of the comparator 14 such that the logical value thereof in the state in which (V1−$\Delta V$) is greater than V2 matches the logical value thereof in the state in which the comparator 14 is inoperable due to the power supply voltage not being supplied.

Thus, even in a case in which the external power supply 210 is not connected to the electronic device 200, the selection circuit 20 can be controlled without involving the operation of the comparator 14. This reduces power consumption by the circuit.

From one point of view, with the first embodiment, in a normal state, the external voltage Vext, which is the first voltage V1, is hypothesized to be greater than the battery voltage Vbat which is the second voltage V2. That is to say, the first voltage V1 is used as the power supply voltage for the comparator 14 on the assumption that the voltage level of the first voltage V1 is higher than that of the battery voltage. Furthermore, comparison is made between the voltage V1, the level of which has been shifted, and the second voltage V2. Such an arrangement avoids the use of headroom close to the power supply voltage of the comparator 14, thereby providing high-precision voltage comparison.

The embodiment has been described for exemplary purposes only, and is by no means intended to be interpreted restrictively. Rather, it can be readily conceived by those skilled in this art that various modifications may be made by making various combinations of the aforementioned components or processes, which are also encompassed in the scope of the present invention. Description will be made below regarding the modification for exemplary purposes.

Description has been made in the first embodiment regarding an arrangement in which only the first voltage V1 is shifted. Also, an arrangement may be made in which the level of the second voltage V2 is shifted in addition to the first voltage V1.

Description has been made in the first embodiment regarding an arrangement in which the voltage comparison circuit 10 is employed in the power supply management circuit 100. Also, the voltage comparison circuit 10 may be used for other voltage comparison processing. Regarding the voltage comparison processing, an arrangement may be made in which the voltage V3, obtained by shifting the first voltage V1, is input to the non-inverting input terminal, and the second voltage V2 is input to the inverting terminal. Also, the settings of the logical levels of the respective signals have been described for exemplary purposes only. The settings may be modified as appropriate using a modified circuit configuration. Description has been made in the first embodiment regarding a circuit which uses the ground voltage (0 v) as the base voltage. Also, the present invention may be applied to a circuit which uses a negative power supply voltage as the base voltage.

SECOND EMBODIMENT

Figure 2:
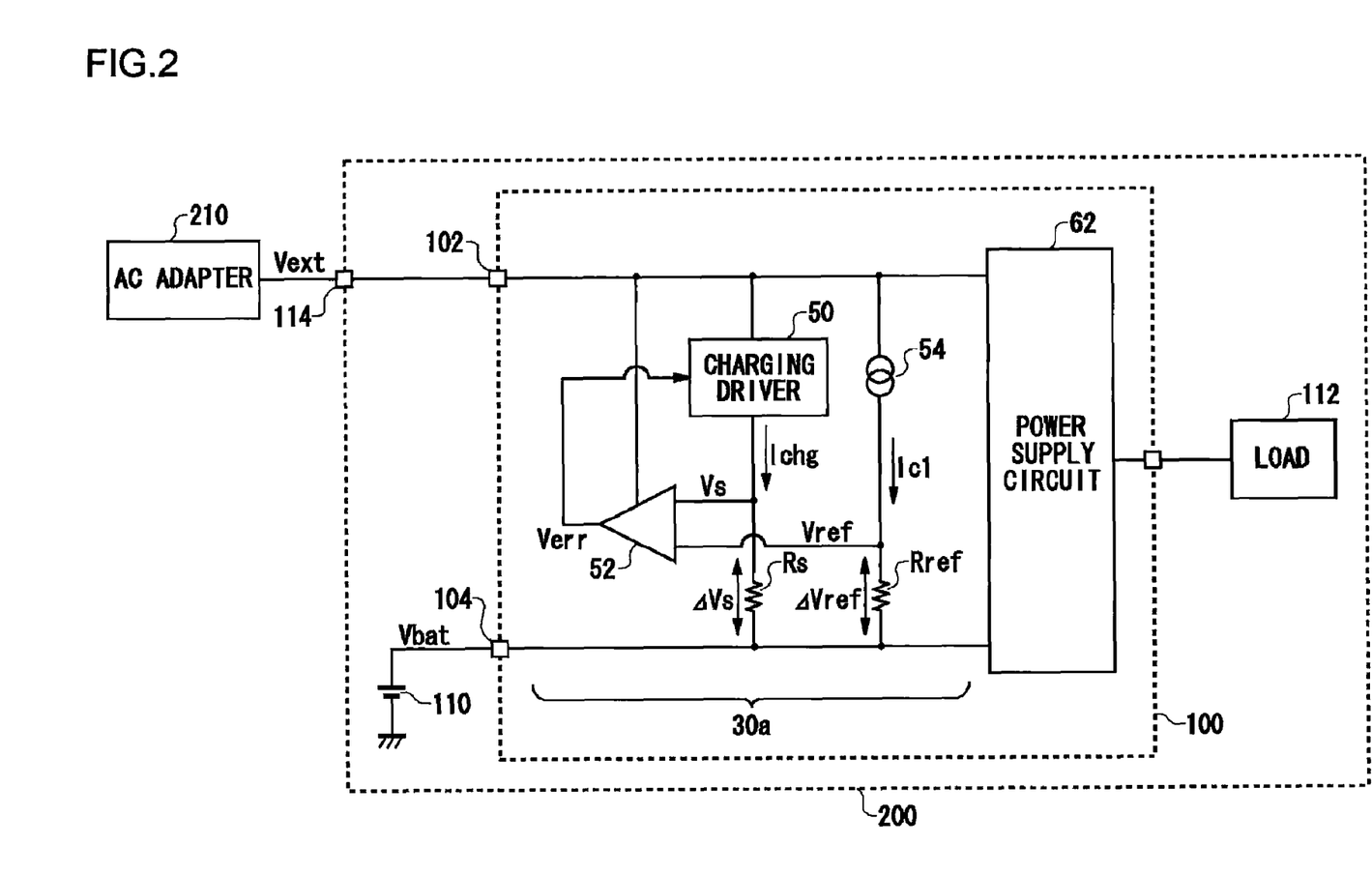
FIG. 2 is a circuit diagram which shows a configuration of an electronic device including a power management circuit according to a second embodiment.

FIG. 2 is a circuit diagram which shows a configuration of an electronic device 200 including a power supply management circuit 100 according to a second embodiment. For example, the electronic device 200 is a battery-driven information terminal device such as a cellular phone terminal, a PDA, a laptop PC, or the like. The electronic device 200 includes the power supply management circuit 100, a battery 110, an adapter terminal 114, and a load 112.

The battery 110 is a secondary battery such as a lithium-ion battery, a nickel hydride battery, or the like, which outputs the battery voltage Vbat. The adapter terminal 114 is a terminal via which an external power supply 210 such as an AC adapter, USB (Universal Serial Bus) port, or the like, can be detachably mounted, and which receives the voltage (which will be referred to as the "external voltage" hereafter) Vext from the external power supply 210. The power supply management circuit 100 charges the battery 110 using the external voltage Vext. Furthermore, the power supply management circuit 100 stabilizes the battery voltage Vbat by stepping up or stepping down the battery voltage Vbat to a predetermined voltage. The voltage thus stabilized is supplied to the load 112. Examples of the load 112 include an unshown DSP, liquid crystal panel, and other analog circuits and digital circuits.

The power supply management circuit 100 includes a charging control unit 30a and a power supply circuit 62. The external voltage Vext is applied to the adapter terminal 102. Furthermore, the battery 110 is connected to the battery terminal 104. The power supply circuit 62 includes a switching regulator or a linear regulator. The power supply circuit 62 selects either the battery voltage Vbat or the external voltage Vext, stabilizes the voltage thus selected, and outputs the voltage thus stabilized to the load 112.

The charging control unit 30a receives the external voltage Vext, and charges the battery 110. That is to say, the charging control unit 30a supplies a constant charging current Ichg to the battery 110, thereby charging the battery 110.

The charging control unit 30a receives the external voltage Vext. The charging control unit 30a includes a charging driver 50, an error amplifier 52, a constant current source 54, a detection resistor Rs, and a reference resistor Rref.

The detection resistor Rs is provided on the charging path from the adapter terminal 102 to the battery 110 via the charging driver 50, i.e., the path through which the charging current Ichg passes. The first terminal of the detection resistor Rs is connected to the battery terminal 104.

When the charging current Ichg passes through the detection resistor Rs, the voltage drop $\Delta Vs$ ($=Ichg \times Rs$) occurs in proportion to the charging current Ichg. The detection voltage Vs that occurs at the second terminal of the detection resistor Rs is represented by the following Expression: $Vs=Vbat+\Delta Vs$.

The first terminal of the reference resistor Rref is connected as a common terminal to the first terminal of the detection resistor Rs. That is to say, the first terminal of the reference resistor Rref is connected to the battery terminal 104. The constant current source 54 supplies a predetermined constant current Ic1 to the reference resistor Rref. The voltage drop $\Delta Vref$ occurs at the reference resistor Rref in proportion to the constant current Ic1. The reference voltage Vref that occurs at the second terminal of the reference resistor Rref is represented by the following Expression: $Vref=Vbat+\Delta Vref$.

The error amplifier 52 generates the error voltage Verr, which corresponds to the difference between the detection voltage Vs that occurs at the second terminal of the detection resistor Rs and the reference voltage Vref that occurs at the second terminal of the reference resistor Rref.

The charging driver 50 receives the error voltage Verr from the error amplifier 52, and charges the battery 110 such that the charging current Ichg matches the predetermined constant current by means of the feedback operation. The charging driver 50 may include an output transistor, one terminal of which is connected to the battery 110 side and the other terminal of which is connected to the external power supply 210 side. With such an arrangement, a voltage is applied to the gate (base) of the output transistor according to the error voltage Verr so as to control the on-resistance of the output transistor, thereby adjusting the charging state. It should be noted that the charging driver 50 is not restricted to such a linear regulator type. Also, a switching regulator may be employed as the charging driver 50. With such an arrangement employing such a switching regulator, the error voltage Verr is pulse-width modulated by slicing the error voltage Verr using a triangular wave or a sawtooth wave cyclic voltage, thereby generating a pulse-width modulated signal. The ON/OFF operation of the switching device is controlled according to the pulse-width modulated signal thus generated. Also, various kinds of known circuits may be used for the charging driver 50.

The external voltage Vext is used as the power supply voltage for the error amplifier 52. That is to say, in a state in which the external power supply 210 is connected to the electronic device 200, the error amplifier 52 can operate at all times regardless of the magnitude of the battery voltage Vbat.

Description will be made regarding the operation of the charging control unit 30a thus configured. The detection voltage Vs is input to one input terminal of the error amplifier 52, and the reference voltage Vref is input to the other input terminal thereof. The charging driver 50 receives the error voltage Verr, and controls the charging current Ichg by means of a feedback operation. When the feedback operation is performed in a stable state, an imaginary short-circuit is formed with respect to the two input voltages of the error amplifier 52.

$$Vs=Vref \quad (1)$$

$$Vs=Vbat+Ic1\times Rref \quad (2)$$

$$Vref=Vbat+Ichg\times Rs \quad (3)$$

When the flow state of the charging current Ich is stable, the following Expression is introduced based upon the Expression (1) through Expression (3).

$$Vbat+Ic1\times Rref=Vbat+Ichg\times Rs \quad (4)$$

Furthermore, the following Expression is obtained by subtracting the term "Vbat" from both sides of the Expression (4).

$$Ic1\times Rref=Ichg\times Rs \quad (5)$$

Furthermore, the following Expression is obtained by transforming the Expression (5).

$$Ichg=Ic1\times Rref/Rs \quad (6)$$

With the charging control unit 30a shown in FIG. 2, the constant current charging operation is performed using the charging current Ichg brought close to the target value represented by the Expression (6).

Figure 3:
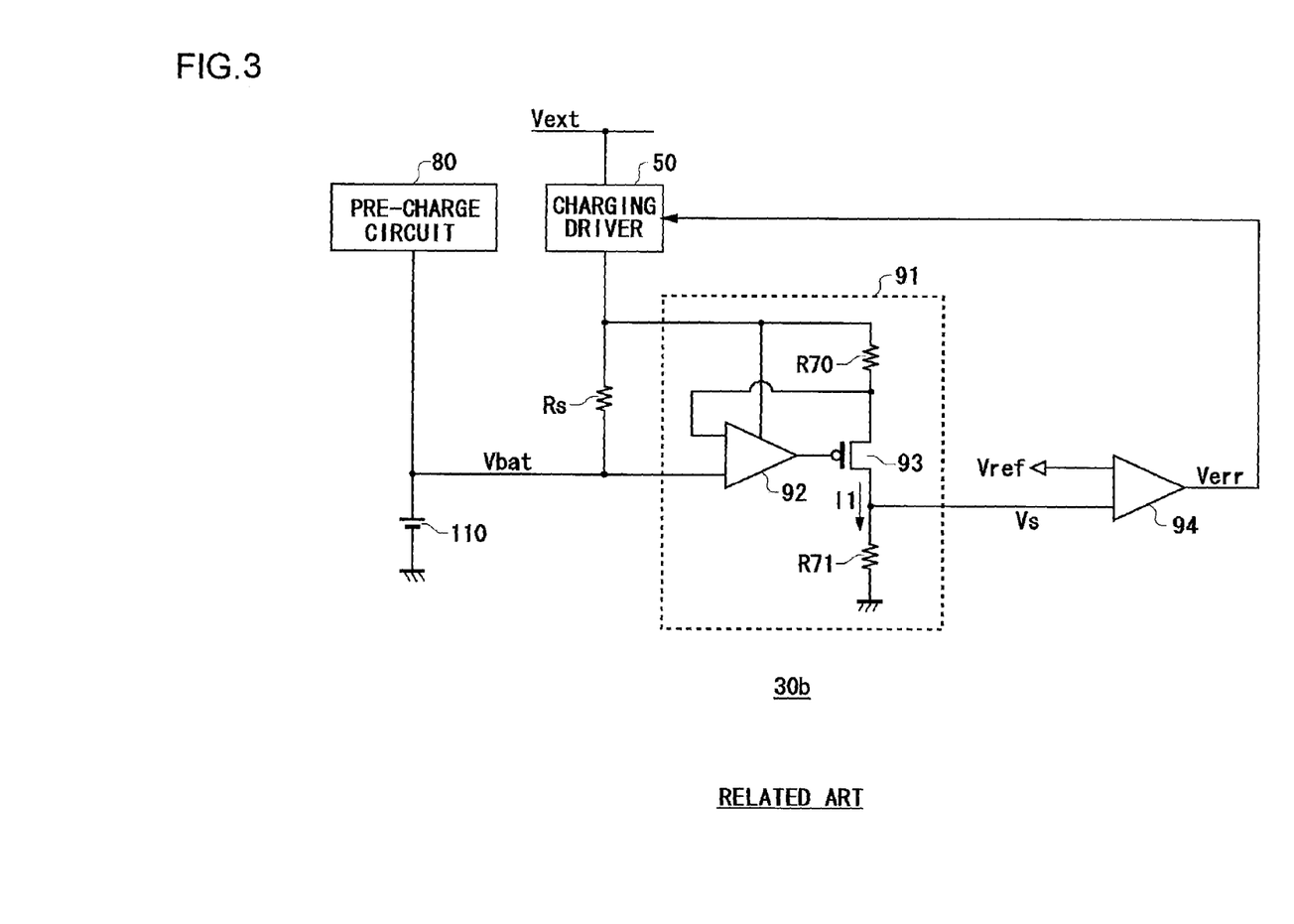
FIG. 3 is a circuit diagram which shows a charging control unit which performs voltage comparison using the ground voltage as the base voltage.

The effects and advantages of the charging control unit 30a shown in FIG. 2 can be more clearly understood by making a comparison with the circuit shown in FIG. 3. FIG. 3 is a circuit diagram which shows a charging control unit 30b which performs voltage comparison using the ground voltage as the base voltage. The charging control unit 30b shown in FIG. 3 includes: a detection resistor Rs provided on the path through which the charging current Ichg passes; a conversion circuit 91 which converts the voltage drop $\Delta Vs$, which occurs at the detection resistor Rs, into the current I1, and which further converts the current I1 into the detection voltage Vs with the ground voltage as the base voltage; an error amplifier 94 which generates the error voltage Verr by amplifying the difference between the reference voltage Vref and the detection voltage Vs; and a charging driver 50 which adjusts the charging current Ichg by means of a feedback operation according to the error voltage Verr.

The conversion circuit 91 includes an error amplifier 92, resistors R70 and R71, and a transistor 93. The resistor R70, the transistor 93, and the resistor R71 are provided in series between one terminal of the detection resistor Rs and the ground terminal. One input terminal of the error amplifier 92 is connected to a node between the resistor R70 and the transistor 93. The other input terminal of the error amplifier 92 is connected to the other terminal of the detection resistor Rs. The output terminal of the error amplifier 92 is connected to the gate of the transistor 93. The voltage drop $\Delta Vs$ ($=Ichg\times Rs$), which occurs at the detection resistor Rs, is applied to both terminals of the resistor R70. With such an arrangement, the current I1 ($=\Delta Vs/R70$) passes through the path that includes the resistor R70, the transistor 93, and the resistor 71. When the current I1 passes through the resistor 71, the voltage drop Vs ($=I1\times R71$) occurs. That is to say, the detection voltage Vs is represented by the following Expression.

$$Vs=Ichg\times Rs/R70\times R71.$$

The feedback operation is performed such that the Expression Vs=Vref is satisfied. Thus, the flow state of the charging current Ichg is stable according to the following Expression that represents the target value of the charging current.

$$Ichg=Vref/Rs\times R70/R71.$$

The circuit shown in FIG. 3 has the following problems.

The first problem is that the circuit shown in FIG. 3 requires the conversion circuit 91, leading to a problem of an increased circuit area.

The second problem is that an imaginary short-circuit is formed at the error amplifier 92, and accordingly, the electric potential at a node between the transistor 93 and the resistor R70 is equal to the battery voltage Vbat. With such an arrangement, when the battery voltage Vbat becomes low, saturation of the transistor 93 occurs. In this case, the voltage drop ΔVs cannot be converted into the detection voltage Vs, leading to a problem in that the constant current charging operation cannot be performed.

The third problem is that the circuit shown in FIG. 3 requires a pre-charge circuit 95 which is capable of charging the battery 110 in a case in which the battery voltage Vbat is low.

By employing the charging control unit 30a shown in FIG. 2, at least one of the aforementioned three problems is solved. That is to say, the charging control unit 30a shown in FIG. 2 does not require the conversion circuit 91, thereby providing a reduced circuit area. Furthermore, even if the battery voltage Vbat becomes low, the charging control unit 30a shown in FIG. 2 operates using the external voltage Vext as the power supply voltage. Thus, such an arrangement prevents the situation in which the charging control unit 30a cannot be operated, thereby ensuring constant current charging. Moreover, such an arrangement provides the constant current charging operation even if the battery voltage Vbat becomes low. Thus, such an arrangement has the advantage that the pre-charge circuit 95 can be eliminated.

Furthermore, by adjusting the constant current Ic1, or by trimming either the detection resistor Rs or the reference resistor Rref, the target value of the charging current Ichg can be adjusted.

The above-described embodiment has been described for exemplary purposes only, and is by no means intended to be interpreted restrictively. Rather, it can be readily conceived by those skilled in this art that various modifications may be made by making various combinations of the aforementioned components or processes, which are also encompassed in the scope of the present invention. Description will be made below regarding the modification according to the second embodiment, for exemplary purposes.

For example, description has been made in the embodiment regarding an arrangement in which the first terminal of the detection resistor Rs and the first terminal of the reference resistor Rref are connected to the battery terminal 104. However, the present invention is not restricted to such an arrangement. The circuit layout of the detection resistor Rs and the reference resistor Rref may be modified as appropriate as long as the first terminals of the detection resistor Rs and the reference resistor Rref are connected to each other such that they form a common terminal.

THIRD EMBODIMENT

Figure 4:
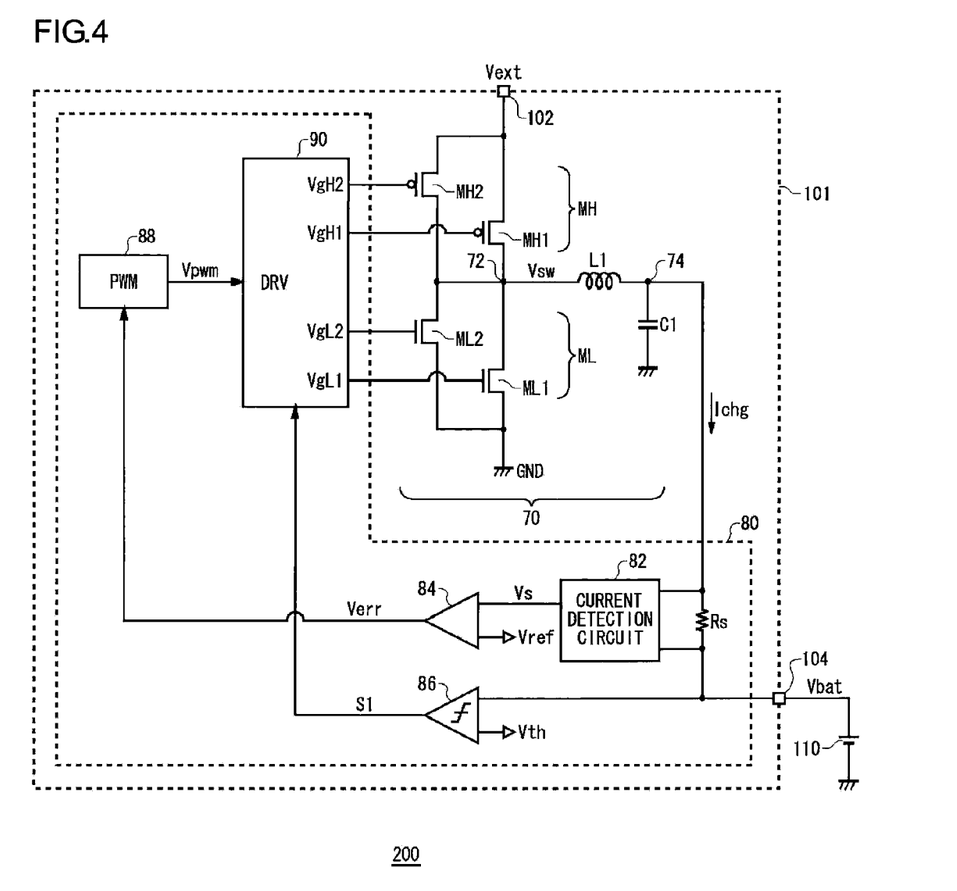
FIG. 4 is a circuit diagram which shows a configuration of an electronic device including the charge control circuit according to a third embodiment.

FIG. 4 is a circuit diagram which shows the configuration of an electronic device 200 including a charge control circuit 100 according to a third embodiment. The electronic device 200 is a battery-driven information terminal device such as a cellular phone terminal, PDA, laptop PC, or the like. The electronic device 200 includes the charge control circuit 100 and the battery 110.

The battery 110 is a secondary battery such as a lithium-ion battery, a nickel hydride battery, or the like, which outputs the battery voltage Vbat. The electronic device 200 includes the adapter terminal 102 such an AC adapter, USB (Universal Serial Bus), or the like, via which an external power supply (not shown) can be detachably mounted. The electronic device 200 receives the voltage (which will be referred to as the "external voltage" hereafter) Vext from the external power supply via the adapter terminal 102. Using the external voltage Vext, the charge control circuit 100 charges the battery 110 connected to the battery terminal 104.

The charge control circuit 100 includes a switching regulator 70 and a control circuit 80. The switching regulator 70 charges the battery 110 using the external voltage Vext. The switching regulator 70 is a synchronous rectification switching regulator, and includes a high-side transistor MH and a low-side transistor ML, each of which is a switching device, an output inductor L1, and an output capacitor C1.

The high-side transistor MH and the low-side transistor ML are provided in series between the adapter terminal 102, to which the external voltage Vext is to be applied, and the ground terminal GND. The high-side transistor MH and the low-side transistor ML repeatedly and alternately perform ON/OFF operations. With such an arrangement, the switching voltage Vsw occurs at a connection node 72 between the high-side transistor MH and the low-side transistor ML.

One terminal of the output capacitor C1 is grounded, and the other terminal thereof is connected to the output terminal 74 of the switching regulator 70. One terminal of the output inductor L1 is connected to the connection node 72, and the other terminal thereof is connected to the output terminal 74. With such an arrangement, a switching voltage, which switches between Vext and 0 V, is applied to the connection node 72. Thus, the external voltage Vext is stepped down, and the voltage thus stepped down occurs at the output terminal 74.

The control circuit 80 includes a detection resistor Rs, a current detection circuit 82, an error amplifier 84, a comparator 86, a pulse width modulator 88, and a driver 90.

The detection resistor Rs is provided on the path from the output terminal 74 of the switching regulator 70 to the battery 110, i.e., the path through which the charging current Ichg passes. The current detection circuit 82 converts the charging current Ichg into the detection voltage Vs using the voltage drop that occurs at the detection resistor Rs. The error amplifier 84 generates the error voltage Verr which indicates the difference between the detection voltage Vs and a predetermined reference voltage Vref.

The pulse width modulator 88 generates the pulse signal Vpwm with a duty ratio (pulse width) adjusted according to the error voltage Verr. The driver 90 drives the switching device of the switching regulator 70 according to the pulse signal Vpwm output from the pulse width modulator 88. As a result, a feedback operation is performed such that the detection voltage Vs matches the reference voltage Vref, i.e., such that the charging current Ichg approaches its target value, thereby charging the battery 110.

FIG. 4 shows the control circuit 80 including only a block which performs a constant current charging operation by maintaining the charging current Ichg at a constant value in a stable state. Also, the constant voltage charging operation may be made as follows. With such an arrangement, the duty ratio of the pulse signal Vpwm is adjusted such that the battery voltage Vbat matches the target value using the battery voltage Vbat as a feedback signal. Also, an arrangement may be made employing the constant voltage charging operation, in addition to the constant current charging operation.

According to the third embodiment, the high-side transistor MH and the low-side transistor ML are each configured such that their on-resistance can be switched. That is to say, the on-resistance of the high-side transistor MH is set to a first value RH1 or a second value RH2 which is greater than the first value RH1, and the on-resistance of the low-side transistor ML is set to a first value RL1 or a second value RL2 which is greater than the first value RL1.

The second value RH2 is set to a value in a range of the order of 2 to 20 times the first value RH1. In the same way, the second value RL2 is set to a value in a range of the order of 2 to 20 times the first value RL1. Each second value is preferably set to a value of the order of 10 times the first value.

During a period τ1 from the start of the charging operation for the battery 110, the on-resistance of the high-side transistor MH is set to the first value RH1, and the on-resistance of the low-side transistor ML is set to the first value RL1.

After the predetermined period τ1 elapses, the on-resistances of the high-side transistor MH and the low-side transistor ML are set based upon the battery voltage Vbat.

When the battery voltage Vbat is smaller than a predetermined threshold voltage Vth, the on-resistance of the high-side transistor MH is set to the greater value, i.e., RH1. On the other hand, when the battery voltage Vbat is greater than the predetermined threshold voltage Vth, the on-resistance of the high-side transistor MH is set to the smaller value, i.e., RH2. Furthermore, when the battery voltage Vbat is smaller than the predetermined threshold voltage Vth, the on-resistance of the low-side transistor ML is set to the greater value, i.e., RL1. On the other hand, when the battery voltage Vbat is greater than the predetermined threshold voltage Vth, the on-resistance of the low-side transistor ML is set to the smaller value, i.e., RL2. For example, for a lithium-ion battery employed for generating a battery voltage Vbat ranging between the 3 V level to the 4.2 V level, the threshold voltage Vth is set to the 2.8 V level.

In order to provide a function of switching the on-resistance, the high-side transistor MH includes two transistors, i.e., a main high-side transistor MH1 and a sub high-side transistor MH2, which are connected in parallel. In the same way, the low-side transistor ML includes two transistors, i.e., a main low-side transistor ML1 and a sub low-side transistor ML2, which are connected in parallel.

In order to switch the effective on-resistance of the high-side transistor MH according to the state of the battery voltage Vbat, the driver 90 switches the internal transistor to be driven in the high-side transistor MH. That is to say, when the on-resistance is to be set to a smaller value, the main high-side transistor MH1 is driven, and the sub high-side transistor MH2 is fixed to the OFF state. Also, instead of the sub high-side transistor MH2 being fixed to the OFF state, the sub high-side transistor MH2 may be driven synchronously with the main high-side transistor MH1. Conversely, when the on-resistance is to be set to a grater value, only the sub high-side transistor MH2 is driven, and the main high-side transistor MH1 is fixed to the OFF state. When the main high-side transistor MH1 (or the sub high-side transistor MH2) is to be fixed to the OFF state, the driver 90 fixes the corresponding gate voltage VgH1 (VgH2) to the high-level state.

In the same way, in order to switch the effective on-resistance of the high-side transistor ML according to the state of the battery voltage Vbat, the driver 90 switches the internal transistor to be driven in the low-side transistor ML. That is to say, when the on-resistance is to be set to a smaller value, the main low-side transistor ML1 is driven, and the sub low-side transistor ML2 is fixed to the OFF state. Also, the sub low-side transistor ML2 may be driven synchronously with the main high-side transistor MH1, instead of fixing the sub low-side transistor ML2 to the OFF state. Conversely, when the on-resistance is to be set to a grater value, only the sub low-side transistor ML2 is driven, and the main low-side transistor ML1 is fixed to the OFF state. When the main low-side transistor ML1 (or the sub low-side transistor ML2) is to be fixed to the OFF state, the driver 90 fixes the corresponding gate voltage VgL1 (VgL2) to the low-level state.

The comparator 86 makes a comparison between the battery voltage Vbat and the threshold voltage Vth, and outputs the control signal S1 according to the comparison result. The driver 90 switches the on-resistances of the high-side transistor MH and the low-side transistor ML according to the control signal S1.

Figure 5:
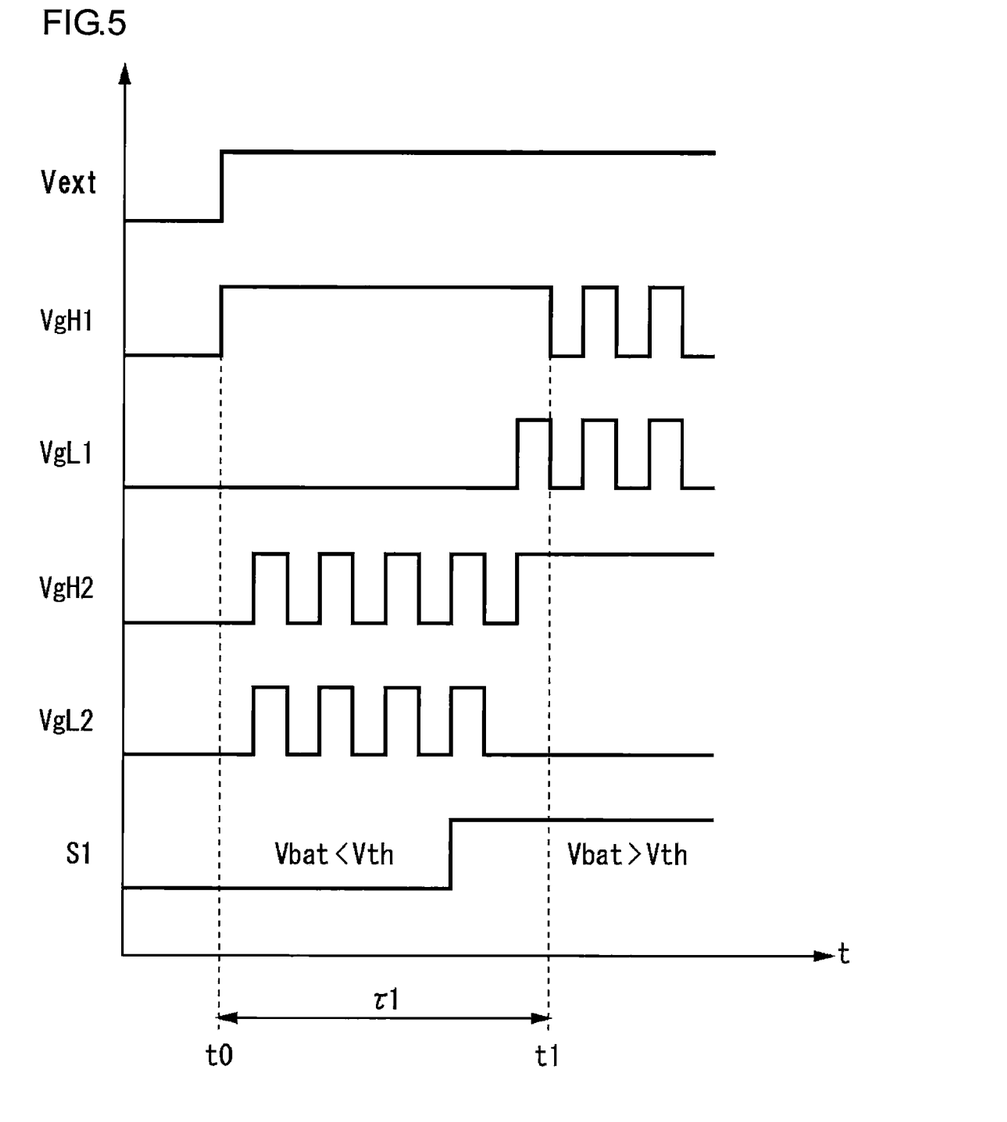
FIG. 5 is a time chart which shows the operation of the charge control circuit shown in FIG. 4.

Description will be made regarding the operation of the charge control circuit 100 thus configured as described above. FIG. 5 is a time chart which shows the operation of the charge control circuit 100 shown in FIG. 4. The vertical axis and the horizontal axis shown in FIG. 5 are expanded or reduced as appropriate to facilitate understanding. Furthermore, each waveform has been simplified to facilitate understanding.

At the point in time to, the external voltage Vext is supplied, thereby starting the charging operation. During a predetermined period τ1 from the start of the charging operation, the effective on-resistances of the high-side transistor MH and the low-side transistor ML are set to the greater values. During this period, the main high-side transistor MH1 and the main low-side transistor ML1 are fixed to the OFF state. On the other hand, the sub high-side transistor MH2 and the sub low-side transistor ML2 are driven.

At the point in time τ1 after the predetermined period τ1 has elapsed, in a case in which Vbat is greater than Vth, the effective on-resistances of the high-side transistor MH and the low-side transistor ML are set to the smaller values. This starts the normal charging operation. On the other hand, in a case in which Vbat is smaller than Vth at the point in time t1, the effective on-resistances of the high-side transistor MH and the low-side transistor ML are continuously maintained at the greater values.

The charge control circuit 100 according to the third embodiment has a configuration which allows the on-resistance of the high-side transistor MH to be switched. With such an arrangement, the on-resistance of the high-side transistor MH is switched according to the status of the circuit, thereby preventing the charging current Ichg from becoming excessively large. In a case in which the battery voltage Vbat is small, the charging current Ichg becomes large. Accordingly, in a case in which the battery voltage Vbat is smaller than the threshold voltage Vth, the on-resistance of the high-side transistor MH is set to the greater value. This suitably prevents excessively large current.

Furthermore, the charge control circuit 100 according to the third embodiment has a configuration which allows the on-resistance of the low-side transistor ML to be switched. Such an arrangement switches the on-resistance of the low-side transistor ML according to the status of the circuit. Such an arrangement can suppress the flow of a reverse current from the battery 110 to the ground terminal GND via the low-side transistor ML.

The above-described embodiment has been described for exemplary purposes only, and is by no means intended to be interpreted restrictively. Rather, it can be readily conceived by those skilled in this art that various modifications may be made by making various combinations of the aforementioned components or processes, which are also encompassed in the scope of the present invention. Description will be made below regarding the modification according to the third embodiment, for exemplary purposes.

Description has been made in the third embodiment regarding an arrangement having a function of switching the on-resistances of both the high-side transistor MH and the on-resistance of the low-side transistor ML. Also, an arrangement may be made having a function of switching either the on-resistance of the high-side transistor MH or the on-resistance of the low-side transistor ML. Description has been made in the third embodiment regarding an arrangement in which the on-resistances of the high-side transistor MH and the low-side transistor ML are switched according to the common threshold voltage Vth. Also, an arrangement may be made in which the on-resistances of the high-side transistor MH and the low-side transistor ML are switched according to respective threshold voltages.

While the preferred embodiments of the present invention have been described using specific terms, such description is for illustrative purposes only, and it is to be understood that changes and variations may be made without departing from the spirit or scope of the appended claims.

What is claimed is:

1. A voltage comparison circuit which makes a comparison between a first voltage and a second voltage, comprising:
a resistor and a constant current source provided in series between the first voltage and a fixed voltage;
a comparator comprising an inverting input terminal, a non-inverting input terminal, and an output terminal, the comparator being configured to receive the second voltage via the inverting input terminal, and receive the voltage at a connection node between the resistor and the constant current source via the non-inverting input terminal; and
a pull-down resistor provided between the output terminal of the comparator and a ground terminal,
wherein a power supply voltage for the comparator is set to the first voltage, and
a voltage level of the first voltage is higher than a voltage of the second voltage.

2. A power supply management circuit comprising:
a first terminal via which an external power supply is connected;
a second terminal via which a battery is connected;
a voltage comparison circuit according to claim 1, which performs voltage comparison with respect to the voltage applied to the first terminal from the external power supply and the battery voltage output from the battery, one of which is used as the first voltage, and the other of which is used as the second voltage;
a selection circuit which selects one of the voltage received from the external power supply and the battery voltage output from the battery, according to an output signal of the voltage comparison circuit; and
an output terminal via which the voltage thus selected by the selection circuit is output to an external load circuit.

3. A power supply management circuit according to claim 2, wherein the voltage comparison circuit receives the voltage from the external power supply as the first voltage, and receives the battery voltage from the battery as the second voltage,
and wherein the comparator receives the voltage from the external power supply as the power supply voltage, receives the battery voltage from the battery via the inverting input terminal, and receives the voltage at a connection node between the resistor and the constant current source via the non-inverting input terminal.

4. A power supply management circuit according to claim 2, further including a charging control unit which charges the battery using the voltage received from the external power supply.

5. An electronic device comprising:
a battery;
an adapter terminal via which an external power supply can be detachably mounted;
a power supply management circuit according to claim 2; and
a load circuit connected to an output terminal of the power supply management circuit.

6. A charge control circuit which receives an external voltage so as to charge a battery, comprising:
a detection resistor which is provided on a charging path for the battery;
a reference resistor, a first terminal of which is connected to a first terminal of the detection resistor such that they form a common terminal;
a constant current source which supplies a predetermined constant current to the reference resistor;
an error amplifier which generates an error voltage according to the difference between a detection voltage at a second terminal of the detection resistor and a reference voltage at a second terminal of the reference resistor; and
a charging driver which receives the error voltage from the error amplifier, and which supplies a charging current to the battery such that the detection voltage matches the reference voltage by means of a feedback operation, thereby charging the battery.

7. A charge control circuit according to claim 6, wherein the first terminal of the detection resistor and the first terminal of the reference resistor are connected to a battery terminal via which the battery is connected.

8. A charge control circuit according to claim 6, wherein the power supply voltage for the error amplifier is set to the external voltage.

9. An electronic device comprising:
a battery;
an adapter terminal via which an external power supply can be detachably mounted; and
a charge control circuit according to claim 6, which charges the battery.

10. A charge control circuit which receives an external voltage so as to charge a battery, comprising:
a synchronous rectification switching regulator which charges the battery using the external voltage;
a pulse modulator which generates a pulse signal with a duty ratio adjusted according to the charging state of the battery; and
a driver which drives a switching device included in the switching regulator according to a pulse signal received from the pulse modulator,
wherein, as a switching device, the switching regulator includes a high-side transistor and a low-side transistor provided in series between an external terminal to which the external voltage is applied and a ground terminal,
and wherein the switching regulator is configured such that at least one of the on-resistances of the high-side transistor and the low-side transistor can be switched.

11. A charge control circuit according to claim 10, wherein, in a case in which the voltage of the battery is smaller than a predetermined threshold voltage, at least one of the on-resistance of the high-side transistor and the on-resistance the low-side transistor, which is the on-resistance of a switchable transistor, is set to a greater value, and wherein, in a case in which the voltage of the battery is greater than the predetermined threshold voltage, at least one of the on-resistance of the high-side transistor and the on-resistance of the low-side transistor is set to a smaller value.

12. A charge control circuit according to claim 10, wherein, during a predetermined period from the start of charging the battery, at least one of the on-resistance of the high-side transistor and the on-resistance the low-side transistor, which is the on-resistance of a switchable transistor, is set to a greater value.

13. A charge control circuit according to claim 10, wherein, during a predetermined period from the start of charging the battery, at least one of the on-resistance of the high-side transistor and the on-resistance the low-side transistor, which is the on-resistance of a switchable transistor, is set to a greater value, and wherein, in a case in which the voltage of the battery is smaller than a predetermined threshold voltage after the predetermined period has elapsed, at least one of the on-resistance of the high-side transistor and the on-resistance the low-side transistor is set to a greater value,
and wherein, in a case in which the voltage of the battery is greater than the predetermined threshold voltage after the predetermined period has elapsed, at least one of the on-resistance of the high-side transistor and the on-resistance the low-side transistor is set to a smaller value.

14. A charge control circuit according to claim 10, wherein the high-side transistor includes a main high-side transistor and a sub high-side transistor provided in parallel with the main high-side transistor, and wherein the driver switches an internal transistor included in the high-side transistor to be driven, according to the state of the battery.

15. A charge control circuit according to claim 10, wherein the low-side transistor includes a main low-side transistor and a sub low-side transistor provided in parallel with the main low-side transistor, and wherein the driver switches an internal transistor included in the low-side transistor to be driven, according to the state of the battery.

16. A charge control circuit according to claim 10, wherein the high-side transistor includes a main high-side transistor and a sub high-side transistor provided in parallel with the main high-side transistor, and wherein the low-side transistor includes a main low-side transistor and a sub low-side transistor provided in parallel with the main low-side transistor,
and wherein the driver switches an internal transistor included in the high-side transistor to be driven, and an internal transistor included in the low-side transistor to be driven, according to the state of the battery.

17. An electronic device comprising:
a battery; and
a charge control circuit according to claim 10, which receives an external voltage from an external power supply so as to charge the battery.

* * * * *